(12) United States Patent
Guler et al.

(10) Patent No.: US 12,249,541 B2
(45) Date of Patent: Mar. 11, 2025

(54) VERTICAL EDGE BLOCKING (VEB) TECHNIQUE FOR INCREASING PATTERNING PROCESS MARGIN

(71) Applicant: Intel Corporation, Santa Clara, CA (US)

(72) Inventors: Leonard P. Guler, Hillsboro, OR (US); Chul-Hyun Lim, Albuquerque, NM (US); Paul A. Nyhus, Portland, OR (US); Elliot N. Tan, Portland, OR (US); Charles H. Wallace, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/096,351

(22) Filed: Jan. 12, 2023

(65) Prior Publication Data

US 2023/0145089 A1    May 11, 2023

Related U.S. Application Data

(62) Division of application No. 16/435,259, filed on Jun. 7, 2019, now Pat. No. 11,594,448.

(51) Int. Cl.
*H01L 21/768* (2006.01)
*H01L 21/311* (2006.01)
*H01L 29/417* (2006.01)
*H01L 29/423* (2006.01)

(52) U.S. Cl.
CPC .. *H01L 21/76816* (2013.01); *H01L 21/31144* (2013.01); *H01L 21/76877* (2013.01); *H01L 29/41725* (2013.01); *H01L 29/42316* (2013.01)

(58) Field of Classification Search
None
See application file for complete search history.

(56) References Cited

U.S. PATENT DOCUMENTS

| 2013/0109148 A1* | 5/2013 | Oh | H01L 29/7926 |
| | | | 438/694 |
| 2015/0214278 A1* | 7/2015 | Satoh | H10B 63/84 |
| | | | 257/295 |

(Continued)

*Primary Examiner* — Khaja Ahmad
(74) *Attorney, Agent, or Firm* — Schwabe, Williamson & Wyatt, P.C.

(57) ABSTRACT

Embodiments disclosed herein include semiconductor devices and methods of forming such semiconductor devices. In an embodiment, a method of fabricating a semiconductor device comprises, forming a first grating of parallel first lines, forming a second grating of parallel second lines, wherein the second lines are substantially orthogonal to the first lines, and wherein the first lines and second lines define a plurality of first openings, disposing a conformal mask layer over the first lines and the second lines, wherein the conformal mask layer partially fills the first openings and defines a second opening within each of the first openings, disposing a hardmask over the conformal mask layer, wherein the hardmask fills the second openings, patterning third openings into the hardmask, wherein the third openings clear the hardmask from at least one of the second openings, and removing the mask layer proximate to cleared second openings to clear first openings.

7 Claims, 16 Drawing Sheets

(56) References Cited

U.S. PATENT DOCUMENTS

| | | | |
|---|---|---|---|
| 2016/0020303 A1* | 1/2016 | Jun | H01L 27/0924 |
| | | | 438/666 |
| 2016/0190009 A1* | 6/2016 | Wallace | H01L 23/5329 |
| | | | 438/631 |
| 2016/0197011 A1* | 7/2016 | Bristol | H01L 21/76816 |
| | | | 438/671 |
| 2016/0240387 A1 | 8/2016 | Yen | |
| 2017/0263551 A1* | 9/2017 | Bristol | H01L 23/53266 |
| 2017/0263553 A1* | 9/2017 | Schenker | H01L 21/76808 |
| 2017/0330761 A1* | 11/2017 | Chawla | H01L 23/53295 |
| 2018/0158694 A1 | 6/2018 | Lin | |
| 2018/0204763 A1 | 7/2018 | Wallace | |
| 2018/0294184 A1* | 10/2018 | Koh | H01L 21/823475 |

\* cited by examiner

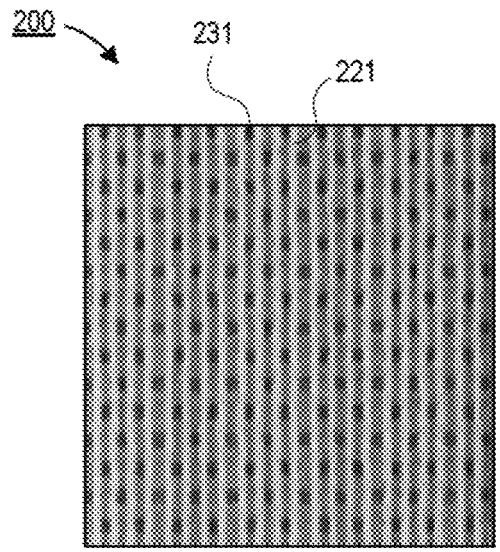
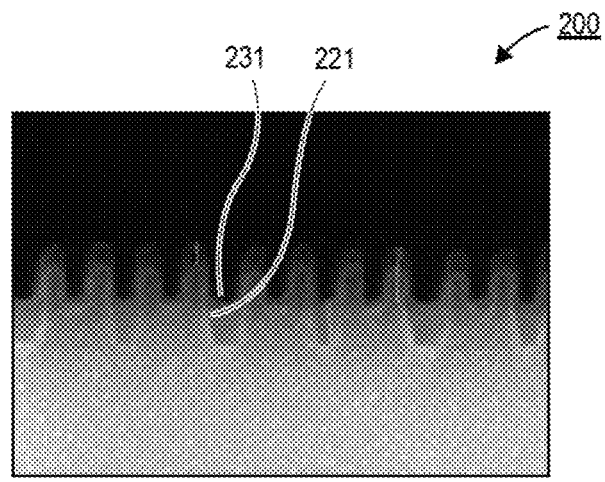
FIG. 10C   FIG. 10D
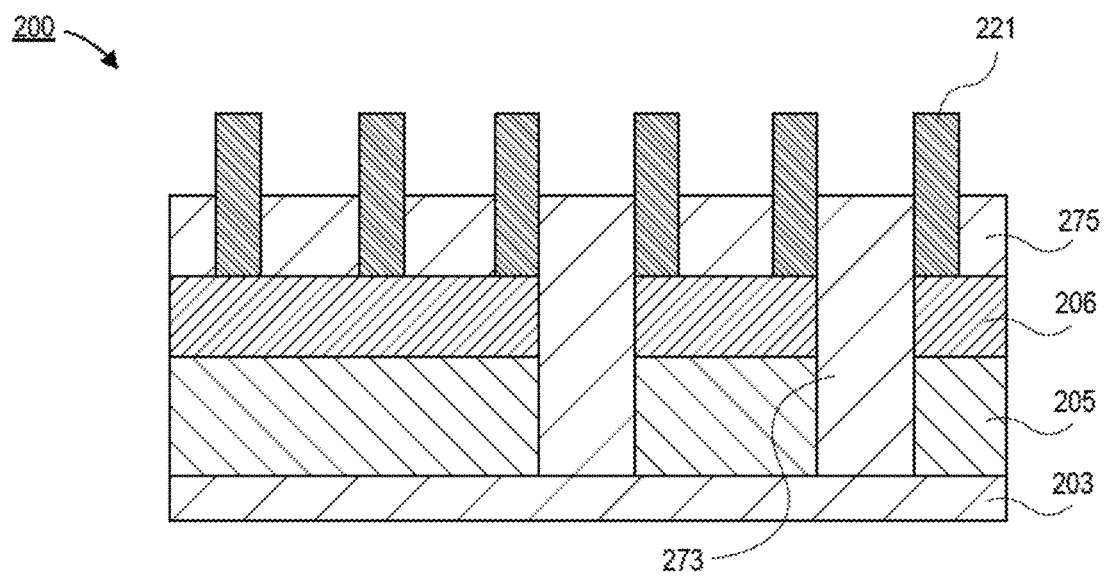
FIG. 11

VERTICAL EDGE BLOCKING (VEB) TECHNIQUE FOR INCREASING PATTERNING PROCESS MARGIN

CROSS-REFERENCE TO RELATED APPLICATIONS

This application is a division of U.S. patent application Ser. No. 16/435,259, filed on Jun. 7, 2019, the entire contents of which is hereby incorporated by reference herein.

TECHNICAL FIELD

Embodiments of the disclosure are in the field of semiconductor structures and processing and, in particular, to methods for improving edge placement error margins by using vertical edge blocking (VEB) features.

BACKGROUND

In back end of line (BEOL) fabrication, conductive vias and insulative plugs are needed in order to provide the desired electrical routing between layers of the BEOL stack. During the fabrication of the vias and plugs, edge placement errors may generate defects in the device. For example, edge placement errors may result in the creation of unwanted vias that result in undesirable shorts in the BEOL stack. In some BEOL stacks, gratings are used to provide increased overlay margins to avoid edge placement errors. However, as critical dimensions continue to scale, the widths of the gratings decrease. Accordingly, the margins for edge placement error continue to decrease.

BRIEF DESCRIPTION OF THE DRAWINGS

FIG. 10C is a plan view micrograph of a semiconductor device at a point of the processing similar to the illustration in FIG. 10A, in accordance with an embodiment.

FIG. 10D is a cross-sectional micrograph of a semiconductor device at a point of the processing similar to the illustration in FIG. 10B, in accordance with an embodiment.

FIG. 11 is a cross-sectional illustration of a semiconductor device after conductive material is disposed in the opening to form a via, in accordance with an embodiment.

DESCRIPTION OF THE EMBODIMENTS

Figure 1B:
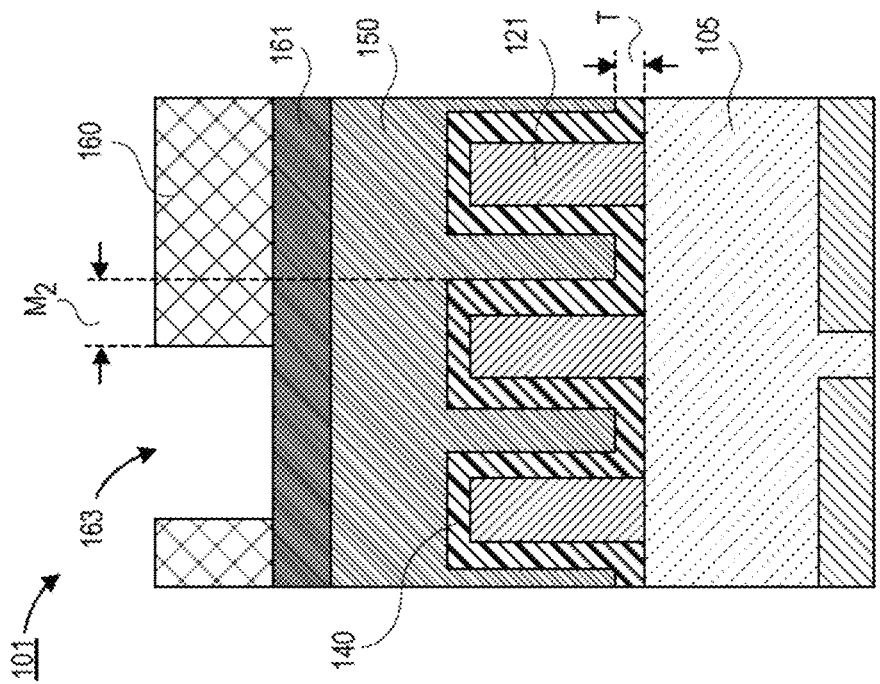
FIG. 1B is a cross-sectional illustration of a semiconductor device with a grating that includes a vertical edge blocking (VEB) mask layer that increases the edge placement error margin, in accordance with an embodiment.

Embodiments described herein comprise semiconductor devices and methods of forming such devices using vertical edge blocking (VEB) features. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

As noted above, edge placement error margins are continuing to decrease as semiconductor devices continue to scale to smaller critical dimensions. An example of the available edge placement error margin is shown in FIG. 1A. A semiconductor device 100 is shown in FIG. 1A. The semiconductor device 100 includes a substrate 105 and a grating 121 including a plurality of parallel lines. A hardmask 150 is disposed over the grating 121, and a resist layer 160 and an antireflective coating 161 are disposed over the hardmask 150. As shown, the grating 121 has a pitch P and each of the lines have a width W. For example, the pitch P may be approximately 30 nm and the width W may be approximately 12 nm.

As shown, an opening 163 over a channel between lines of the grating 121 is patterned into the resist layer 160. The opening 163 may have an edge placement error margin $M_1$. In cases where the pitch P is approximately 30 nm and the width W is approximately 12 nm, the edge placement error margin $M_1$ is only approximately 6 nm. That is, all overlay errors in the system can only add up to approximately 6 nm. If the overlay errors exceed 6 nm, there is a chance that the opening 163 will inadvertently extend over a neighboring channel. This will result in defects in the semiconductor device (e.g., undesirable vias or plugs).

Accordingly, embodiments disclosed herein include a vertical edge blocking (VEB) mask layer that increases the edge placement error margin. The increase in the margin allows for greater protection against printing defects and allows for improved scaling of the semiconductor device to smaller critical dimensions (CDs). An example of a semiconductor device 101 that utilizes a VEB mask layer 140 is shown in FIG. 1B.

Figure 1A:
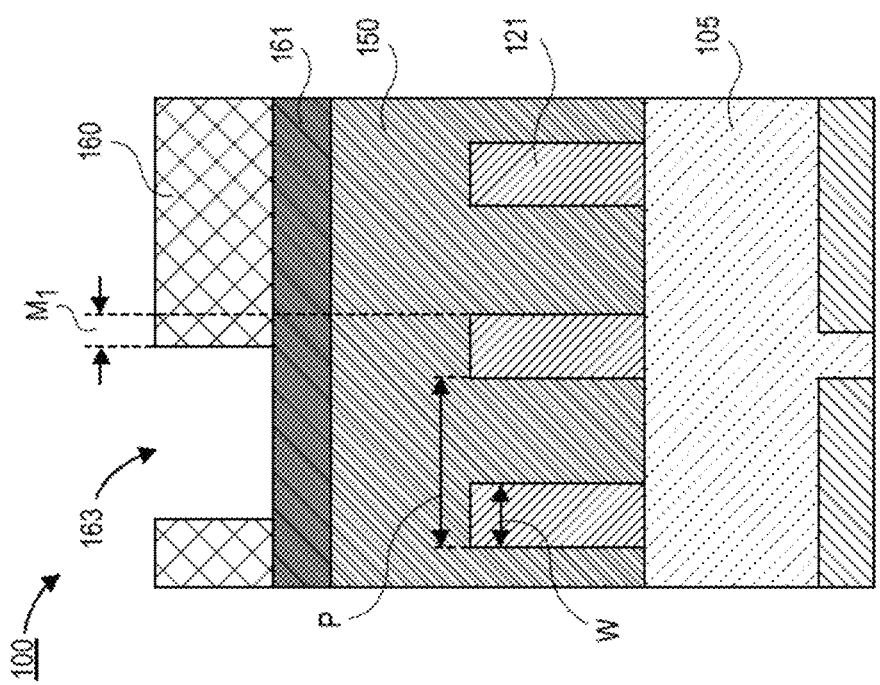
FIG. 1A is a cross-sectional illustration of a semiconductor device illustrating the edge placement error margin for patterning vias in an interconnect layer.

Referring now to FIG. 1B, a cross-sectional illustration of a semiconductor device 101 is shown, in accordance with an embodiment. The semiconductor device 101 may be substantially similar to the semiconductor device 100 illustrated in FIG. 1A, with the exception that the grating 121 is lined with a VEB mask layer 140. The VEB mask layer 140 is a conformal layer that is disposed along sidewall surfaces and top surfaces of the grating 121. The inclusion of the VEB mask layer 140, therefore, increases the width of the lines in the grating 121. As such, the edge placement error margin $M_2$ is increased. For example, the edge placement error margin $M_2$ may be increased by an amount substantially equal to a thickness T of the VEB mask layer 140. For example, the VEB mask layer 140 may have a thickness of approximately 5 nm. In such embodiments, the edge placement error margin $M_2$ may be increased from 6 nm to 11 nm.

In FIG. 1B, the grating 121 is only shown as a one-dimensional grating. However, it is to be appreciated that a two-dimensional grating (i.e., a cross-grating) may also benefit from the use of a VEB mask layer in order to improve overlay margins in both directions. Examples of processes which use a VEB mask layer with a cross-grating architecture are shown in FIGS. 2A-11.

Figure 2A:
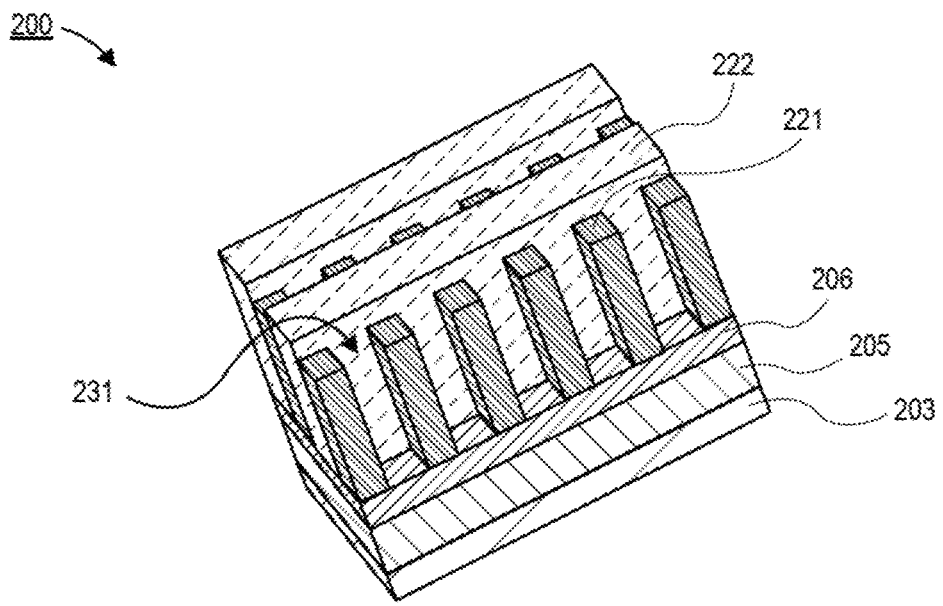
FIG. 2A is a perspective view illustration of a semiconductor device that includes a cross-grating, in accordance with an embodiment.
Figure 2B:
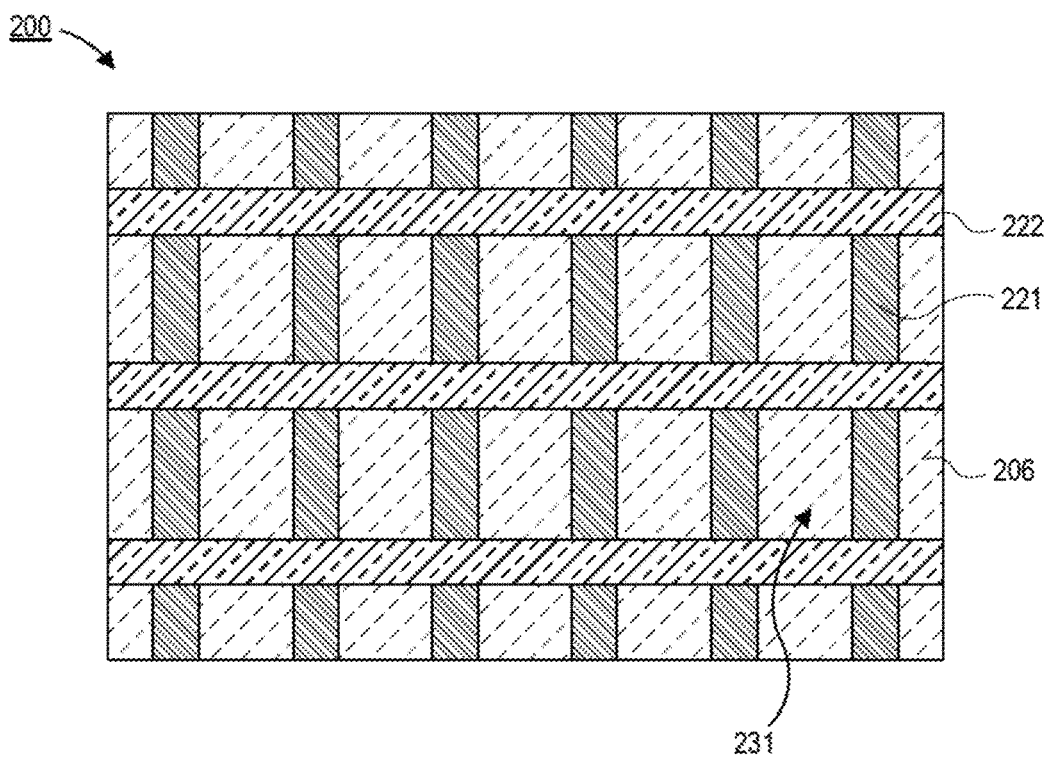
FIG. 2B is a plan view illustration of the semiconductor device in FIG. 2A, in accordance with an embodiment.

Referring now to FIGS. 2A and 2B, a perspective view illustration and a corresponding plan view illustration of a semiconductor device 200 are shown, respectively, in accordance with an embodiment. In the illustrated embodiment, only a portion of the back end of line (BEOL) stack is shown. It is to be appreciated that the BEOL stack may be disposed over a semiconductor substrate. In an embodiment, the underlying semiconductor substrate may be a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials, such as substrates including germanium, carbon, or group III-V materials. The semiconductor substrate, depending on the stage of manufacture, often includes transistors, integrated circuitry, and the like. The substrate may also include semiconductor materials, metals, dielectrics, dopants, and other materials commonly found in semiconductor substrates.

In the illustrated embodiment, an interconnect layer of the BEOL stack is shown. For example, a metal layer 203 and a stack of one or more substrate layers 205, 206 over the metal layer 203 are illustrated. The metal layer 203 may comprise conductive traces used to provide interconnects to devices on the underlying semiconductor substrate. In an embodiment, as is also used throughout the present description, metal layers or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In an embodiment, the one or more substrate layers 205, 206 may include interlayer dielectric (ILD) material. As used throughout the present description, ILD material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by techniques, such as, for example, chemical vapor deposition (CVD), physical vapor deposition (PVD), or by other deposition methods.

In an embodiment, a cross-grating may be formed over the substrate 206. The cross-grating may comprise a plurality of parallel first lines 221 that extend in a first direction and a plurality of parallel second lines 222 that extend in a second direction. For example, the first direction is substantially orthogonal to the second direction. First lines 221 may be spaced at a first pitch and the second lines may be spaced at a second pitch. In some embodiments, the first pitch is substantially equal to the second pitch, though embodiments are not limited to such configurations. The first lines 221 and the second lines 222 of the cross-grating may be any suitable materials that are etch selective to the underlying substrate 206 and to each other. For example, the first lines 221 and the second lines 222 may comprise hardmask materials. In some embodiments, one or both of the first lines 221 and the second lines 222 may comprise a single material layer, or a stack of more than one material layers.

In an embodiment, the first lines 221 and the second lines 222 define a plurality of first openings 231 that expose portions of the underlying substrate 206. In the embodiment illustrated in FIG. 2A there is a topographical difference between the first lines 221 and the second lines 222 (e.g., the second lines 222 are wider and have a top surface that is above top surfaces of the first lines 221). However, it is to be appreciated that embodiments disclosed herein are not limited by topography, and any cross-grating architecture may be used in accordance with embodiments disclosed herein.

Figure 3A:
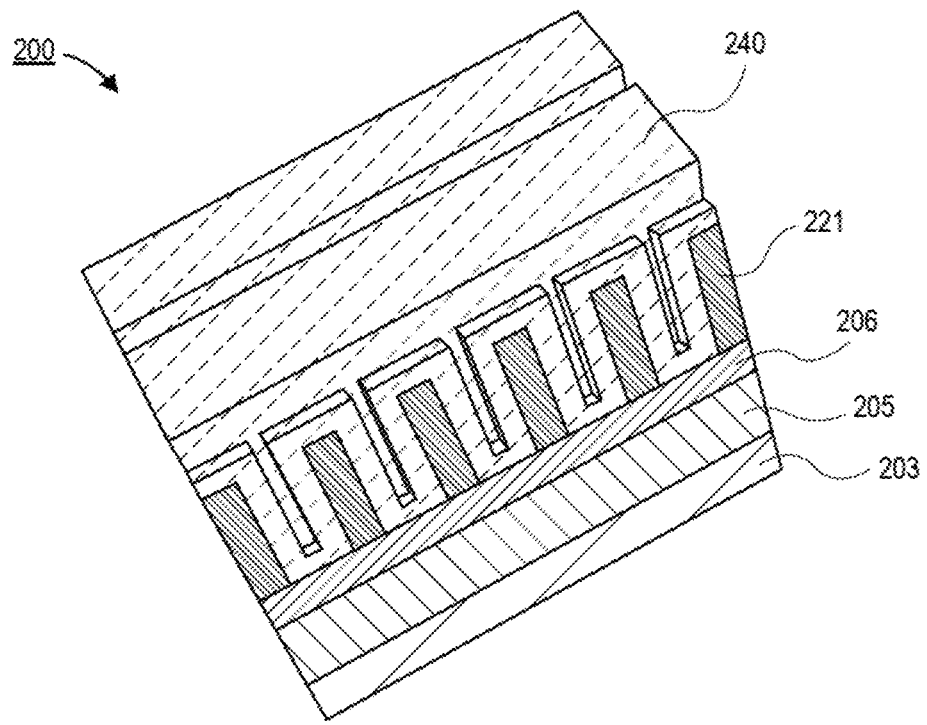
FIG. 3A is a perspective view illustration of a semiconductor device after a VEB mask layer is conformally disposed over the cross-grating, in accordance with an embodiment.
Figure 3B:
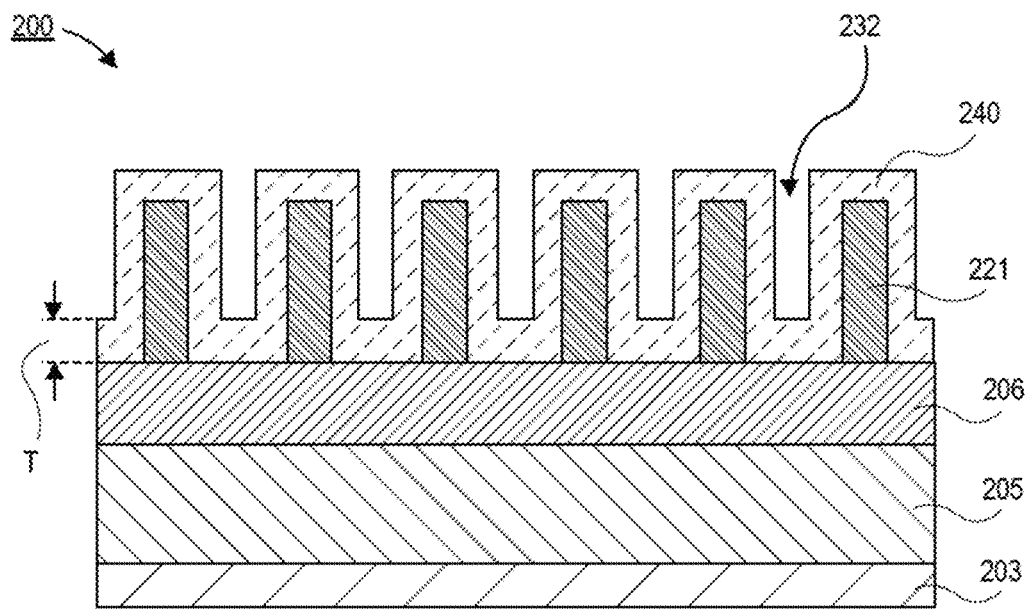
FIG. 3B is a cross-sectional illustration of the semiconductor device in FIG. 3A, in accordance with an embodiment.

Referring now to FIGS. 3A and 3B a perspective view illustration and a corresponding cross-sectional illustration after a vertical edge blocking (VEB) mask layer 240 is disposed over the cross-grating are shown, respectively, in accordance with an embodiment. In an embodiment, the VEB mask layer 240 is a conformal layer. That is, the VEB mask layer 240 may line the sidewalls and top surface of the first lines 221 and the second lines 222 of the cross-grating. The VEB mask layer 240 may also be disposed over exposed top surfaces of the substrate 206 between the cross-grating. Any suitable conformal deposition process may be used to deposit the VEB mask layer 240. For example, the VEB mask layer 240 may be deposited may include atomic layer deposition (ALD), CVD, or the like. In an embodiment, the VEB mask layer 240 may have a thickness T. In an embodiment, the thickness T may be approximately 10 nm or less, or approximately 5 nm or less. The VEB mask layer 240 may comprise a material that is etch selective to surrounding materials. For example, the VEB mask layer 240 may comprise silicon and nitrogen (e.g., SiN), silicon and oxygen (e.g., $SiO_2$), aluminum and oxygen (e.g., $Al_2O$), or titanium and nitrogen (e.g., TiN). In an embodiment, the VEB mask layer 240 reduces the width of the openings defined by the cross-grating. For example, second openings 232 may be defined by the vertical portions of the VEB mask layer 240.

Figure 4:
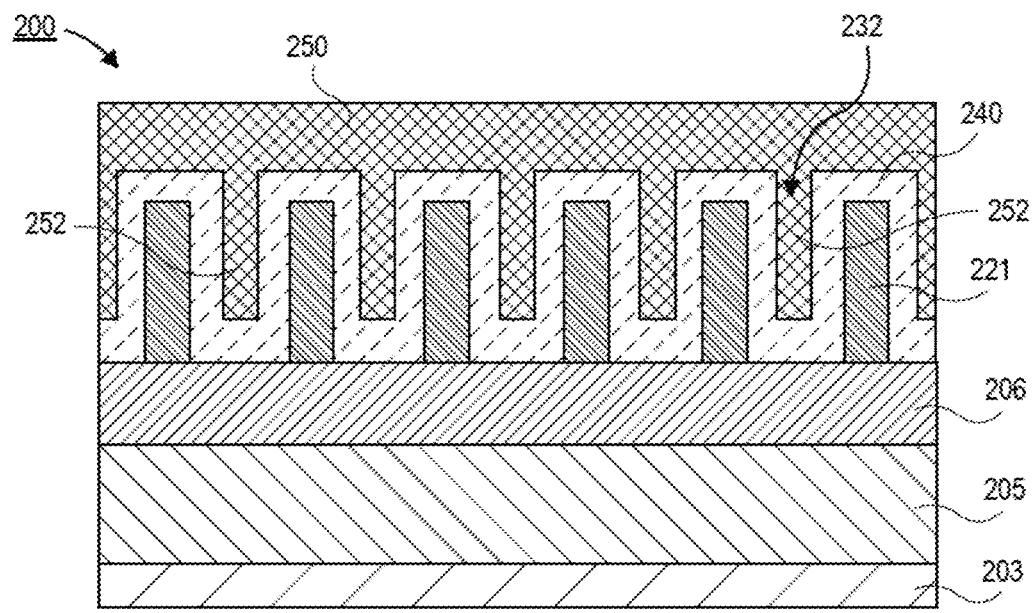
FIG. 4 is a cross-sectional illustration of a semiconductor device after a hardmask is disposed over the VEB mask layer, in accordance with an embodiment.

Referring now to FIG. 4, a cross-sectional illustration after a hardmask 250 is disposed over the VEB mask layer 240 is shown, in accordance with an embodiment. In an embodiment, the hardmask 250 may fill the second openings 232. The portion of the hardmask 250 that fills the second openings 232 may be referred to herein as hardmask 252. In an embodiment, the hardmask 250 may be any suitable material that is etch selective to the VEB mask layer 240. For example, the hardmask 252 may be a carbon hardmask, or the like.

Figure 5:
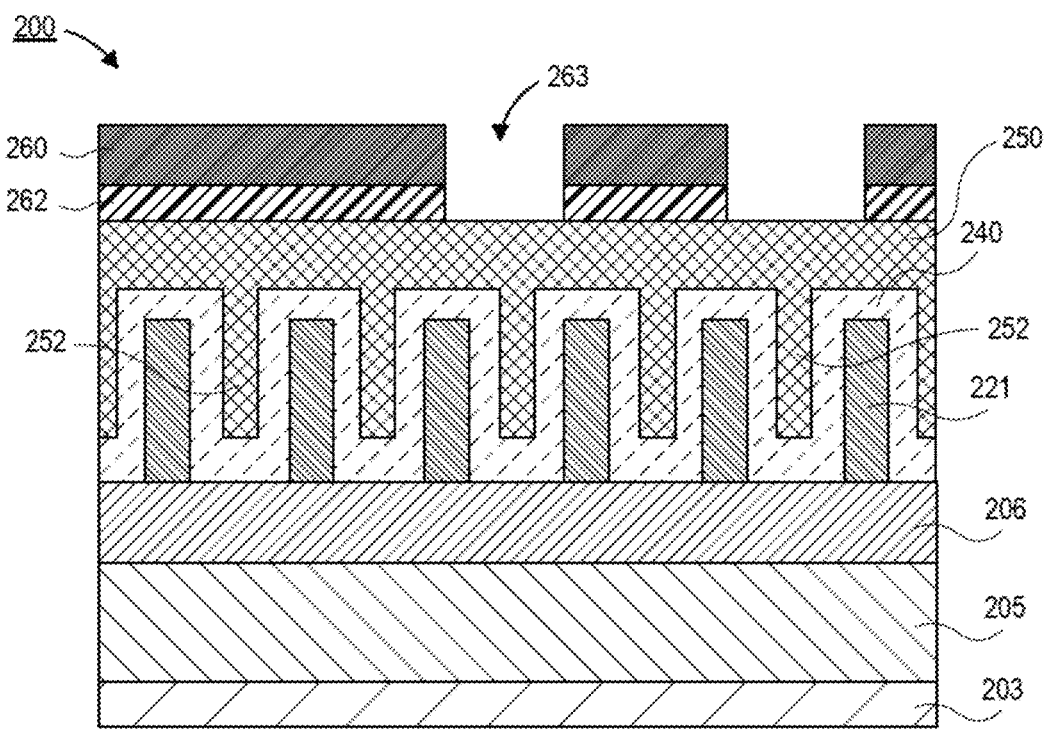
FIG. 5 is a cross-sectional illustration after a resist layer is disposed over the hardmask layer and patterned, in accordance with an embodiment.

Referring now to FIG. 5, a cross-sectional illustration after a patterning stack is disposed over the hardmask 250 and is patterned is shown, in accordance with an embodiment. In an embodiment, the patterning stack may comprise an antireflective coating (ARC) 262 and a resist layer 260. It is to be appreciated that additional layers may also be included in the patterning stack. In an embodiment, an opening 263 may be patterned into the resist layer 260 (e.g., with a photolithography process). The opening 263 may be positioned above one of the second openings 232.

Figure 6A:
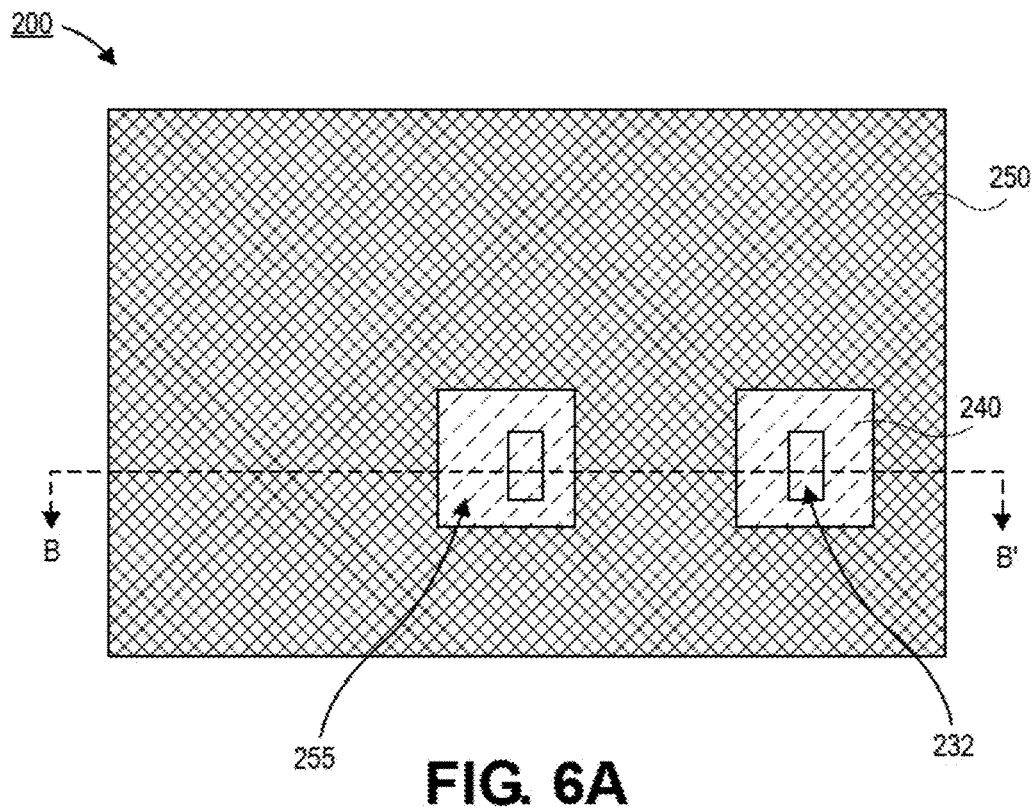
FIG. 6A is a plan view illustration of a semiconductor device after the hardmask is patterned, in accordance with an embodiment.
Figure 6B:
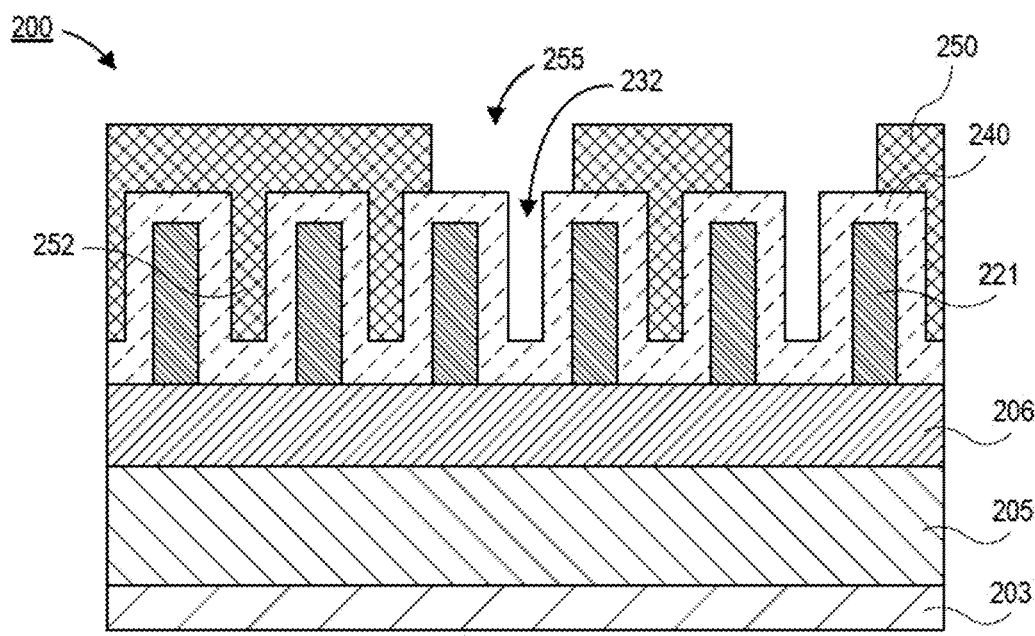
FIG. 6B is a cross-sectional illustration of the semiconductor device in FIG. 6A, in accordance with an embodiment.

Referring now to FIGS. 6A and 6B, a plan view illustration and a corresponding cross-sectional illustration along line B-B' after the hardmask 250 is patterned are shown, respectively, in accordance with an embodiment. In an embodiment, the opening 263 in the resist layer 260 is transferred into the hardmask 250 to form third openings 255 with an etching process. In an embodiment, the patterning process that forms the third opening 255 clears the exposed portions of the hardmask 250 including the portions of the hardmask 252 in the exposed second 232. That is, the second opening 232 is substantially cleared during the patterning process, and sidewall surfaces of the VEB mask layer 240 are exposed.

Figure 7A:
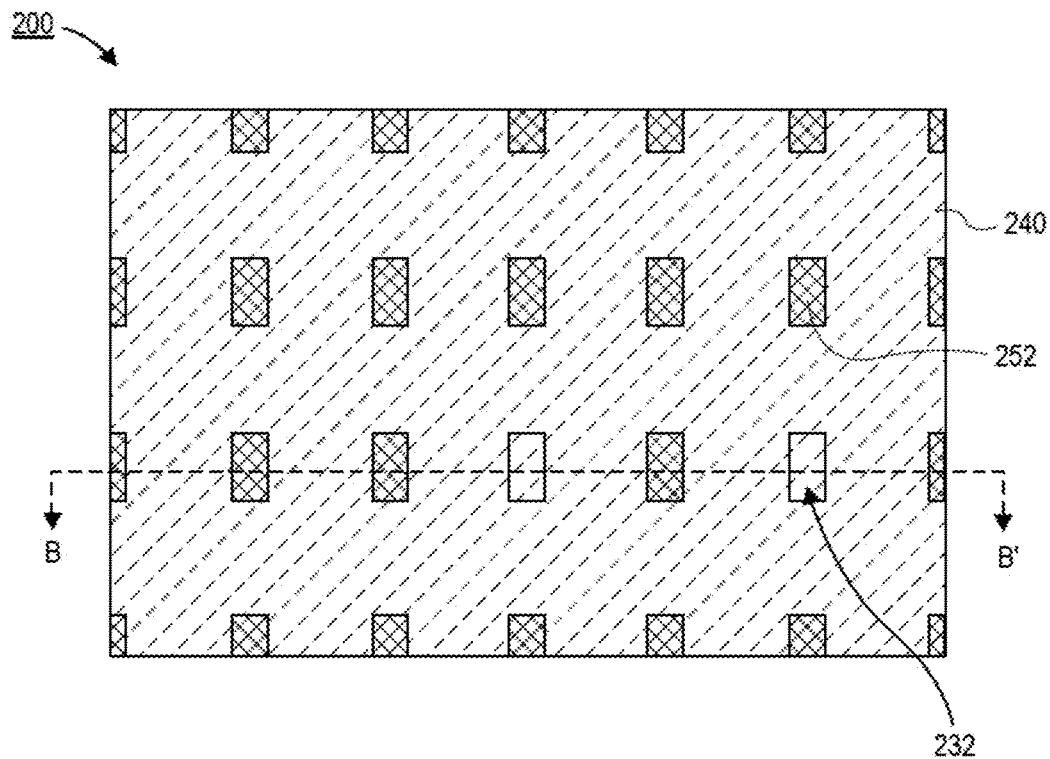
FIG. 7A is a plan view illustration of a semiconductor device after the patterned hardmask is recessed, in accordance with an embodiment.
Figure 7B:
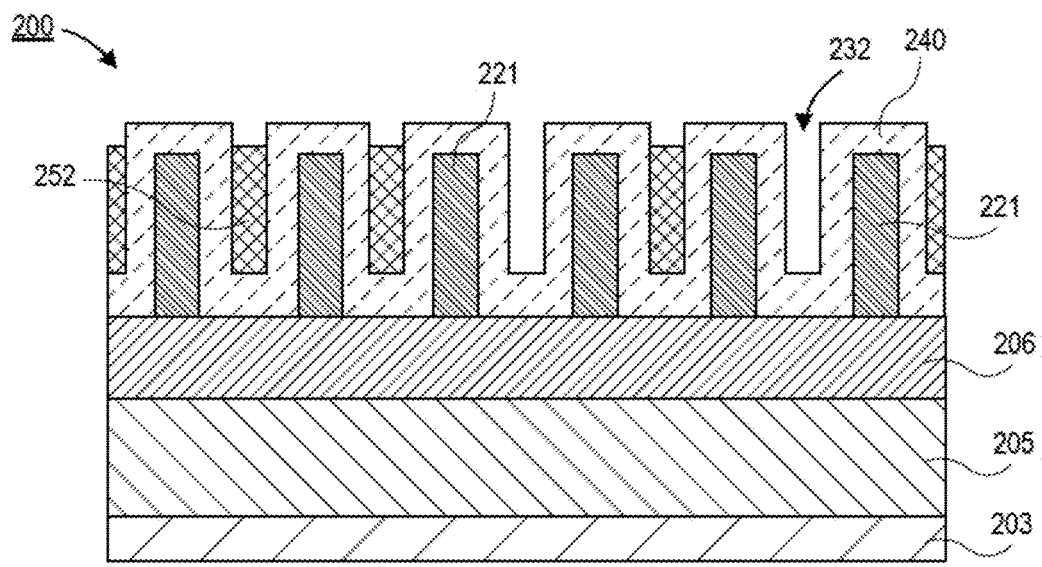
FIG. 7B is a cross-sectional illustration of the semiconductor device in FIG. 7A, in accordance with an embodiment.

Referring now to FIGS. 7A and 7B, a plan view illustration and a corresponding cross-sectional illustration along line B-B' after the hardmask 250 is recessed are shown, respectively, in accordance with an embodiment. In an embodiment, the hardmask 250 may be recessed so that only portions of the hardmask 252 in the second openings 232 remain. As shown, the top surfaces of the portions of the hardmask 252 are recessed below a top surface of the VEB mask layer 240. In an embodiment, the hardmask 250/252 may be recessed with an etching process.

Figure 8A:
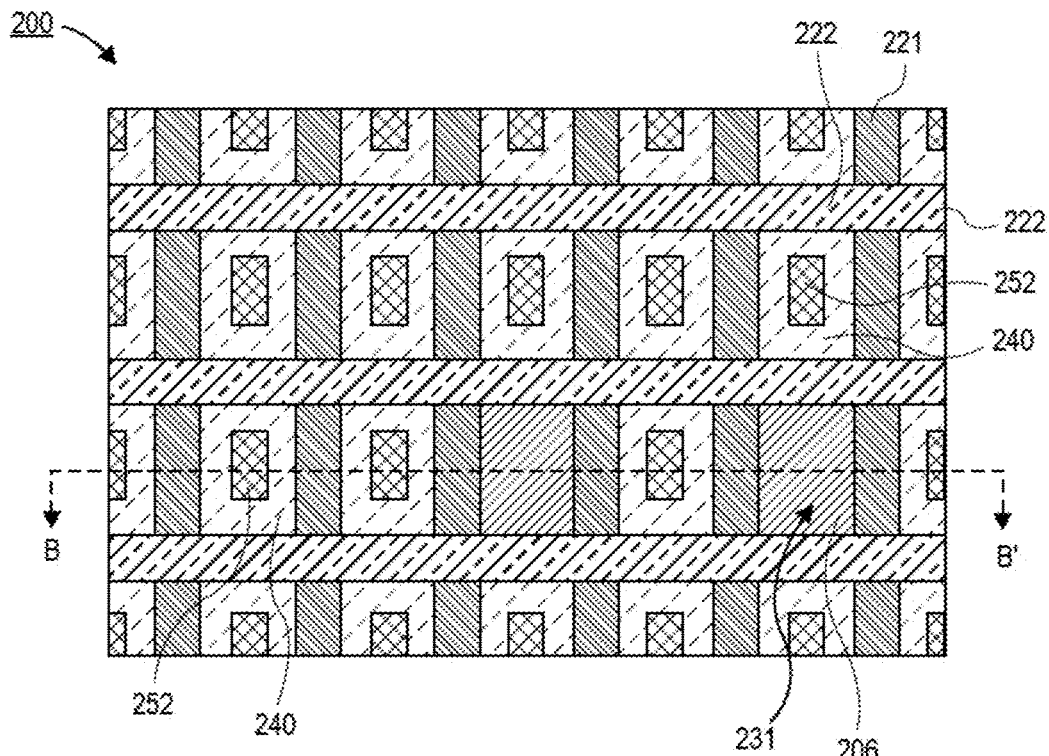
FIG. 8A is a cross-sectional illustration of a semiconductor device after the VEB mask layer is selectively removed in desired openings defined by the cross-grating, in accordance with an embodiment.
Figure 8B:
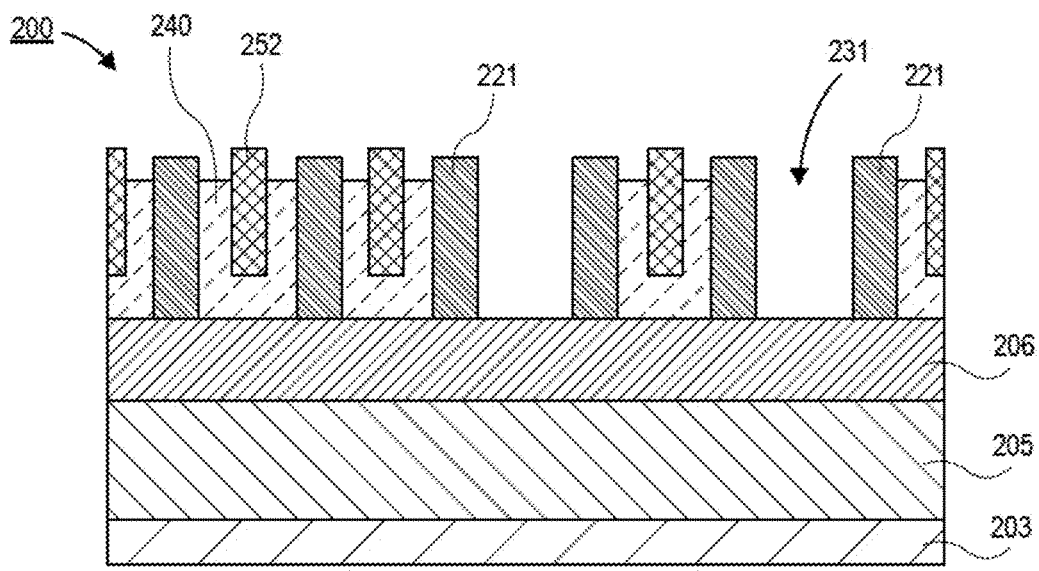
FIG. 8B is a cross-sectional illustration of the semiconductor device in FIG. 8A, in accordance with an embodiment.

Referring now to FIGS. 8A and 8B, a plan view illustration and a cross-sectional illustration along line B-B' after the VEB mask layer 240 is selectively removed are shown, respectively, in accordance with an embodiment. In an embodiment, the VEB mask layer 240 may be etched with an isotropic etching process. The use of an isotropic etching process allows for the portion of the VEB mask layer 240 in the exposed second openings 232 to be cleared while preserving the portions of the VEB mask layer 240 that are protected by the hardmask 252. The selective removal of the VEB mask layer 240 fully clears the first openings 231 and provide locations where full width vias may be patterned.

In a particular embodiment, the isotropic etching process is a timed etching process. For example, the etching process may be timed so that after the opening 231 is entirely cleared, the etching process is stopped. Since the sidewall surfaces of the VEB mask layer 240 are protected by the hardmask 252, the use of a timed etch limits the removal from the top surface. However, due to the isotropic nature of the etching process, the top surfaces of the remaining portions of the VEB mask layer 240 may be recessed below a top surface of the hardmask 252 in some embodiments.

Figure 8C:
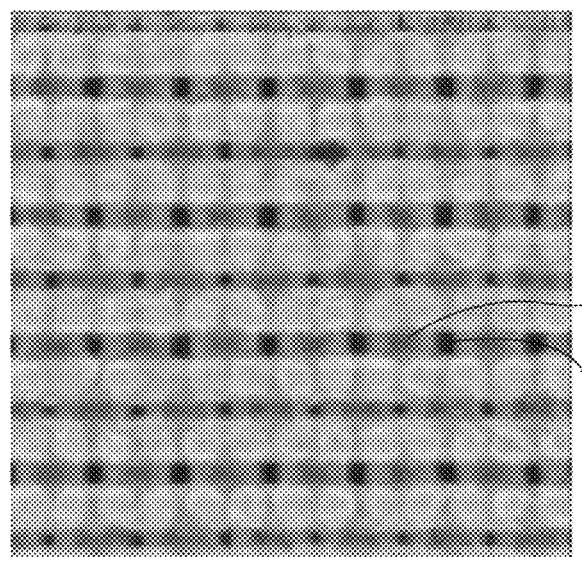
FIG. 8C is a micrograph of a semiconductor device at a point of the processing similar to the illustration in FIG. 7A, in accordance with an embodiment.
Figure 8D:
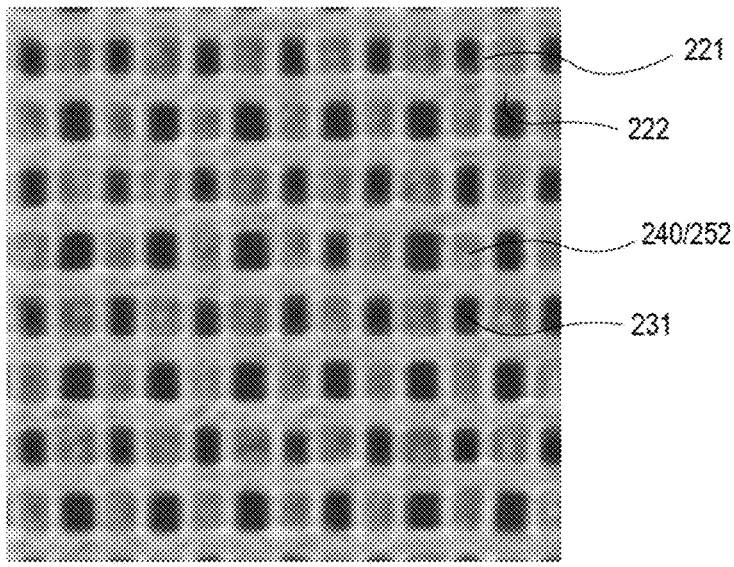
FIG. 8D is a micrograph of a semiconductor device at a point of the processing similar to the illustration in FIG. 8A, in accordance with an embodiment.

Referring now to FIGS. 8C and 8D, a pair of plan view micrographs that depict the changes resulting from the selective removal of portions of the VEB mask layer 240 are shown, respectively, in accordance with an embodiment. In FIG. 8C, the narrow second openings 232 are clearly illustrated as the black rectangular shaped regions. The neighboring openings of the cross-grating are not clearly defined since they are filled by a combination of the VEB mask layer 240 and the hardmask 252. In FIG. 8D, the micrograph depicts a semiconductor device after the VEB mask layer 240 is preferentially etched to fully reveal selected first openings 231. As shown, the first openings 231 are significantly larger than the second openings 232 in FIG. 8C. Additionally, the etching process reveals the top surfaces of the first lines 221 and the second lines 222 of the cross-grating. The full reveal of the selected first openings 231 occurs without removing the VEB mask layer 240 and the hardmask 252 from neighboring locations in the cross-grating.

Figure 9A:
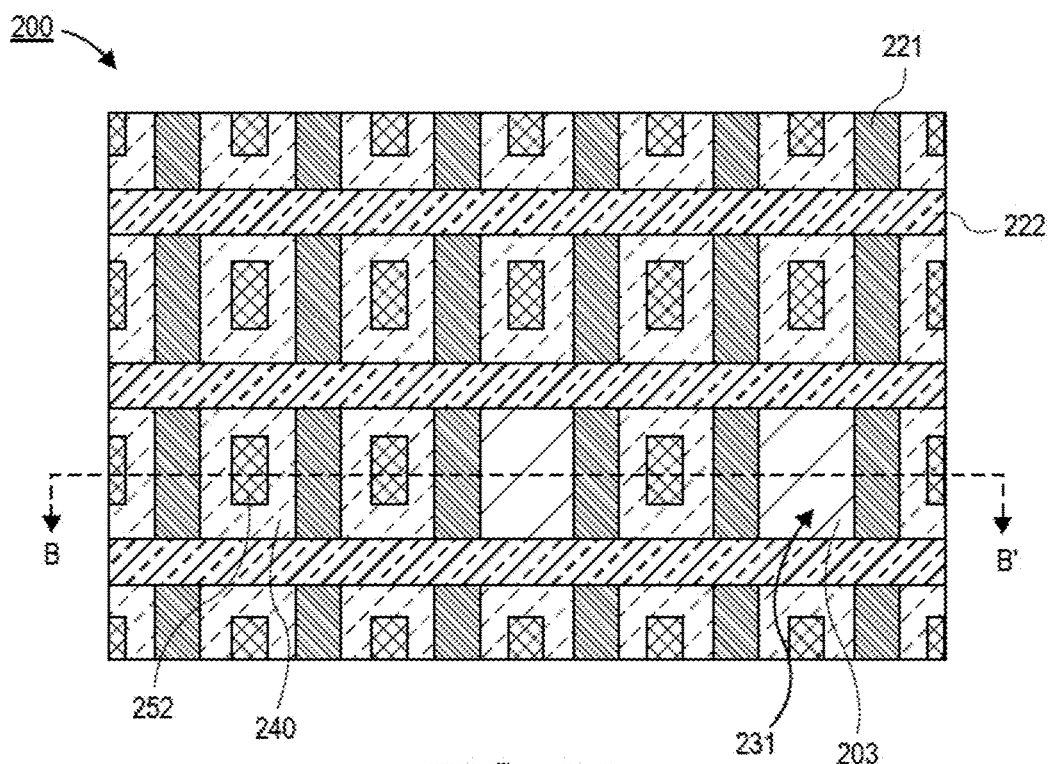
FIG. 9A is a plan view illustration of a semiconductor device after the openings in the cross-grating are transferred into the underlying substrate, in accordance with an embodiment.
Figure 9B:
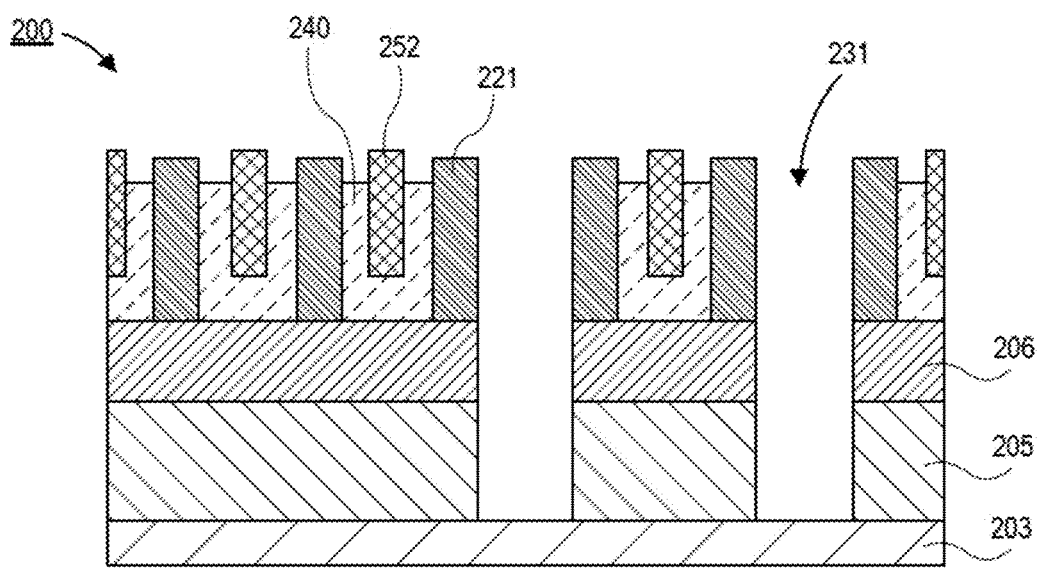
FIG. 9B is a cross-sectional illustration of the semiconductor device in FIG. 9A, in accordance with an embodiment.

Referring now to FIGS. 9A and 9B, a plan view illustration and a corresponding cross-sectional illustration along line B-B' after the opening 231 is transferred into the substrate 206/205 are shown, respectively, in accordance with an embodiment. As shown, the residual portions of the VEB mask layer 240, the hardmask 252, and the first lines 221 and second lines 222 of the cross-grating provide protection to the underlying substrate 206 where a via opening is not desired.

Figure 10A:
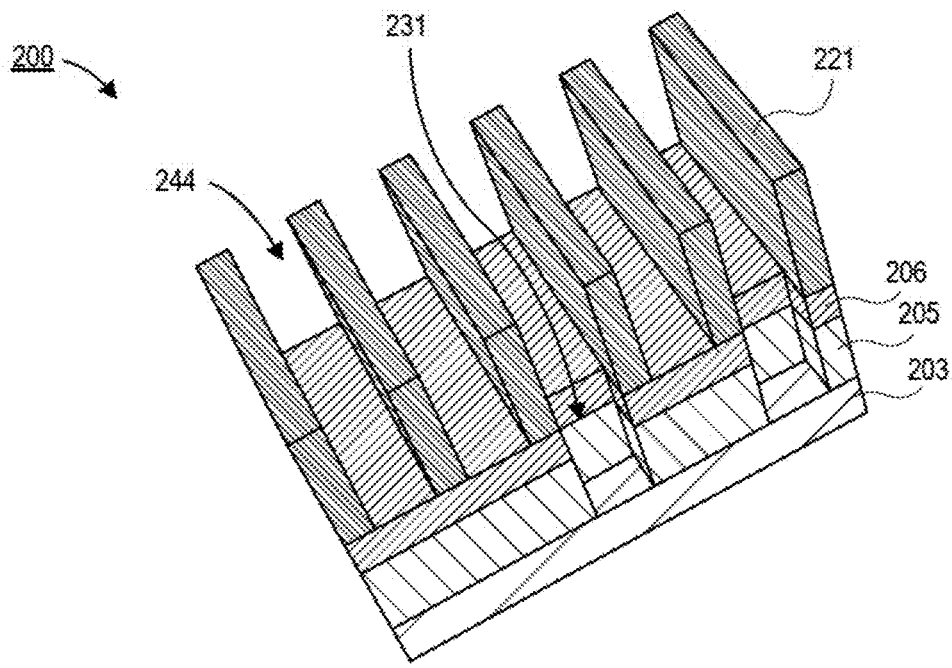
FIG. 10A is a perspective view illustration of a semiconductor device after the VEB mask layer, the hardmask, and lines of the cross-grating are removed, in accordance with an embodiment.
Figure 10B:
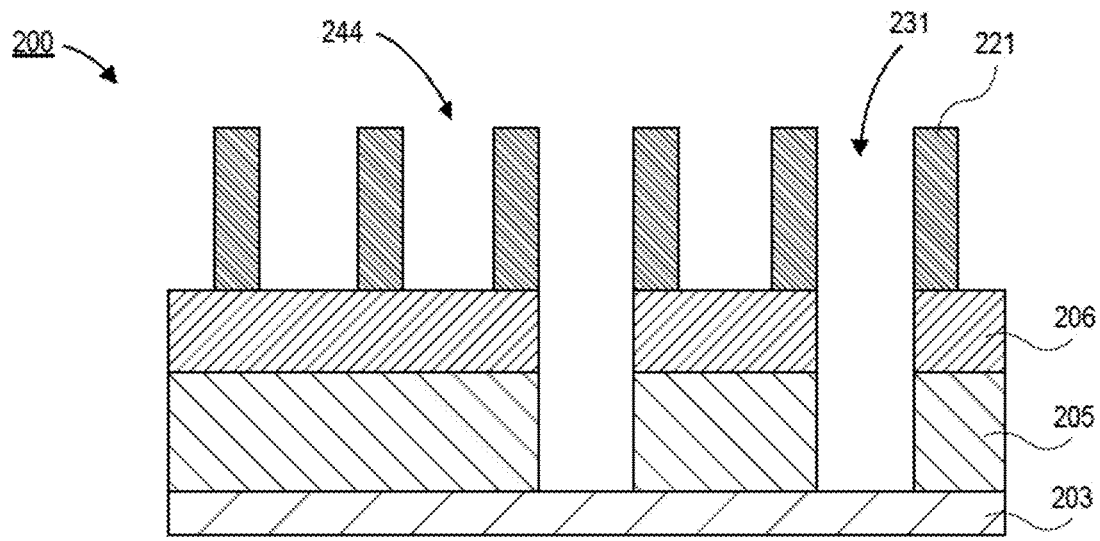
FIG. 10B is a cross-sectional illustration of the semiconductor device in FIG. 10A, in accordance with an embodiment.

Referring now to FIGS. 10A and 10B, a perspective view illustration and a cross-sectional illustration after the second lines 222 and residual portions of the VEB mask layer 240 and the hardmask 252 are removed are shown, respectively, in accordance with an embodiment. In an embodiment, the VEB mask layer 240 and the hardmask 252 may be removed with one or more etching processes. The second lines 222 may then be removed to so that channels 244 between neighboring first lines 221 are provided.

Referring now to FIGS. 10C and 10D, a plan view micrograph and a cross-sectional micrograph of a semiconductor device 200 corresponding to the illustrations in FIGS. 10A and 10B are shown, respectively, in accordance with an embodiment. In the plan view illustration in FIG. 10C, the first lines 221 and the openings 231 are clearly illustrated. As shown, the openings 231 have sidewalls that are defined by surfaces of the first lines 221. Additionally, the openings 231 are substantially rectangular in shape due to the use of a cross-grating pattern to define the openings 231. In FIG. 10D, the cross-sectional illustration illustrates that the profile of the first openings 231 and the first lines 221 need not be substantially rectangular. Due to processing conditions, the first lines 221 may develop a rounded top surface. Similarly, the openings 231 may exhibit a rounded bottom surface. Furthermore, due to processing non-uniformities, the profiles, widths, etc. of the openings 231 may exhibit some variability in width and/or pitch.

Referring now to FIG. 11, a cross-sectional illustration of the semiconductor device 200 after vias 273 and a second metal layer 275 are formed is shown, in accordance with an embodiment. The vias 273 and the second metal layer 275 may be deposited with any suitable process, such as electroplating, or the like. In an embodiment, the vias 273 provides electrical coupling between the first metal layer 203 and the second metal layer 275.

Referring now to FIGS. 12A-12F, a plan view illustration and a series of cross-sectional illustrations depicting a process for forming a semiconductor device 300 that includes a VEB mask layer is shown, in accordance with an embodiment.

Figure 12A:
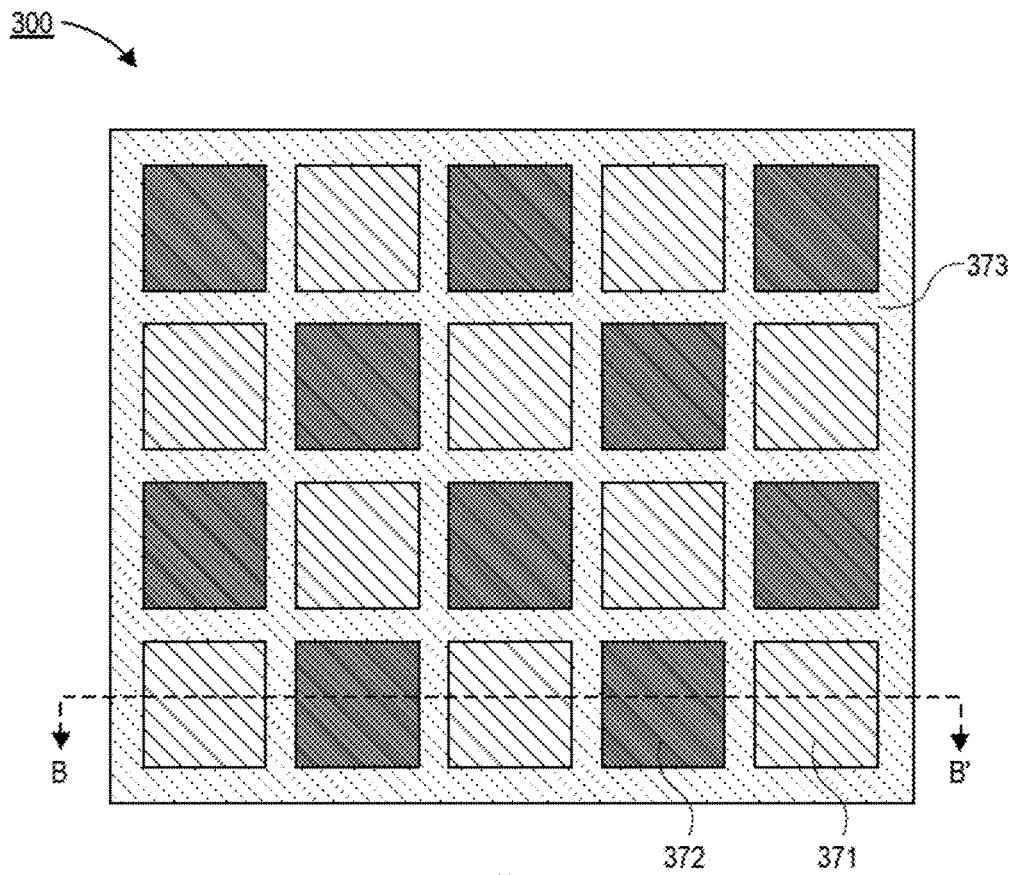
FIG. 12A is a plan view illustration of a semiconductor device that comprises a grid of source/drain (S/D) contacts and gate contacts in a first interlayer dielectric (ILD), in accordance with an embodiment.
Figure 12B:
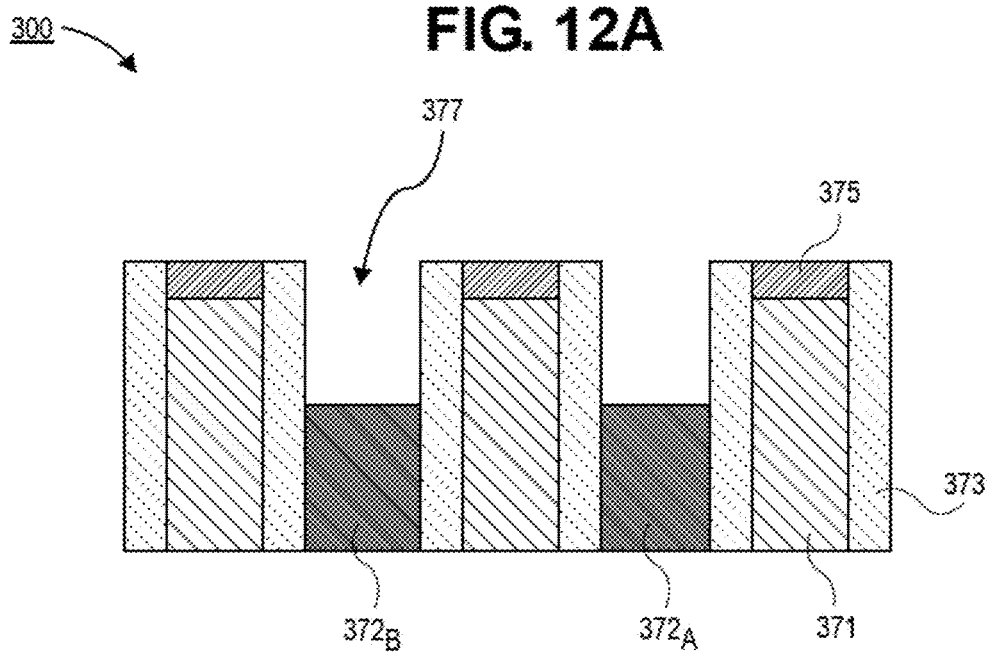
FIG. 12B is a cross-sectional illustration of the semiconductor device in FIG. 12A, in accordance with an embodiment.

Referring now to FIGS. 12A and 12B, a plan view illustration and a cross-sectional illustration of a semiconductor device 300 are shown, respectively, in accordance with an embodiment. As shown, the semiconductor device 300 may comprise a plurality of source/drain (S/D) contacts 371 and a plurality of gate contacts 372 arranged in a grid like pattern. That is, the S/D contacts 371 and the gate contacts 372 may be arranged in an alternating pattern. The S/D contacts 371 and the gate contacts 372 may be embedded in a first ILD layer 373.

In an embodiment, top surfaces of the gate contacts 372 may be recessed below top surfaces of the S/D contacts 371. Openings 377 may pass through a portion of the first ILD 373 to expose the top surfaces of the gate contacts 372. In an embodiment, top surfaces of the S/D contacts 371 may also be covered by a hardmask layer 375.

Figure 12C:
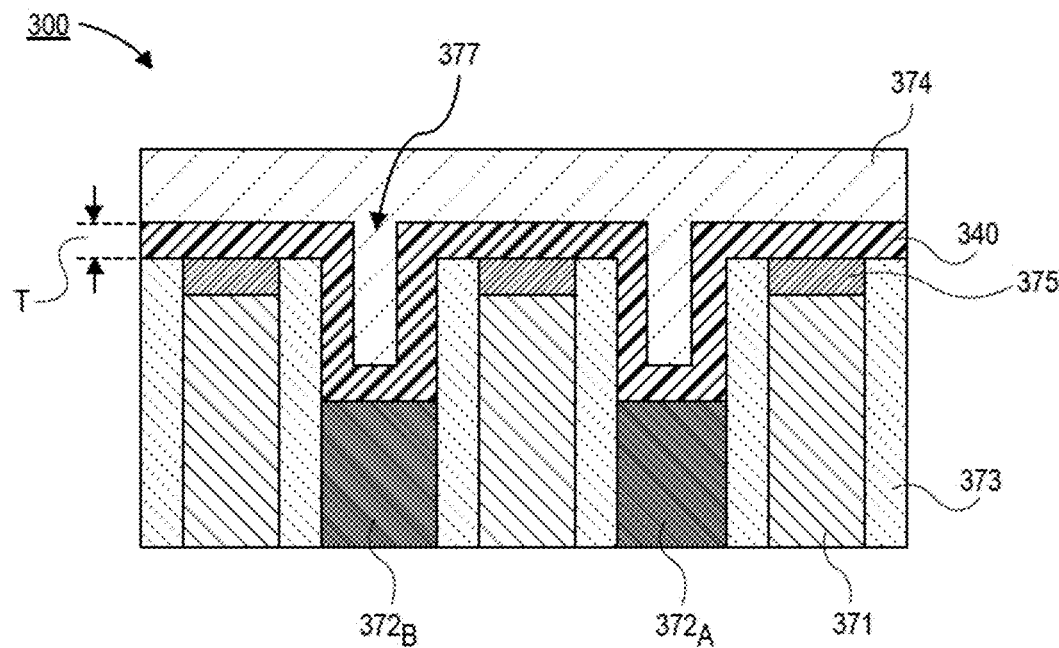
FIG. 12C is a cross-sectional illustration of a semiconductor device after a VEB mask layer and a second ILD are disposed over the device, in accordance with an embodiment.

Referring now to FIG. 12C, a cross-sectional illustration of the semiconductor device 300 after a VEB mask layer 340 and a second ILD 374 are disposed over exposed surfaces is shown, in accordance with an embodiment. In an embodiment, the VEB mask layer 340 may be positioned over the S/D contacts 371, the gate contacts 372, and the first ILD 373. The VEB mask layer 340 is a conformal layer. As such, the VEB mask layer 340 extends along sidewall surfaces of the openings 377. The remaining volume of the openings 377 may be filled with the second ILD 374. In an embodiment, a portion of the VEB mask layer 340 may be between the second ILD 374 and the S/D contact 371. In an embodiment, the VEB mask layer 340 may be substantially similar to the VEB mask layers described above, with the exception that the VEB mask layer 340 is an insulative material. Accordingly, the VEB mask layer 340 may have a thickness T that is 10 nm or less or 5 nm or less, and the VEB mask layer 340 may comprise silicon and nitrogen (e.g., SiN), silicon and oxygen (e.g., $SiO_2$), or aluminum and oxygen (e.g., $Al_2O$).

Figure 12D:
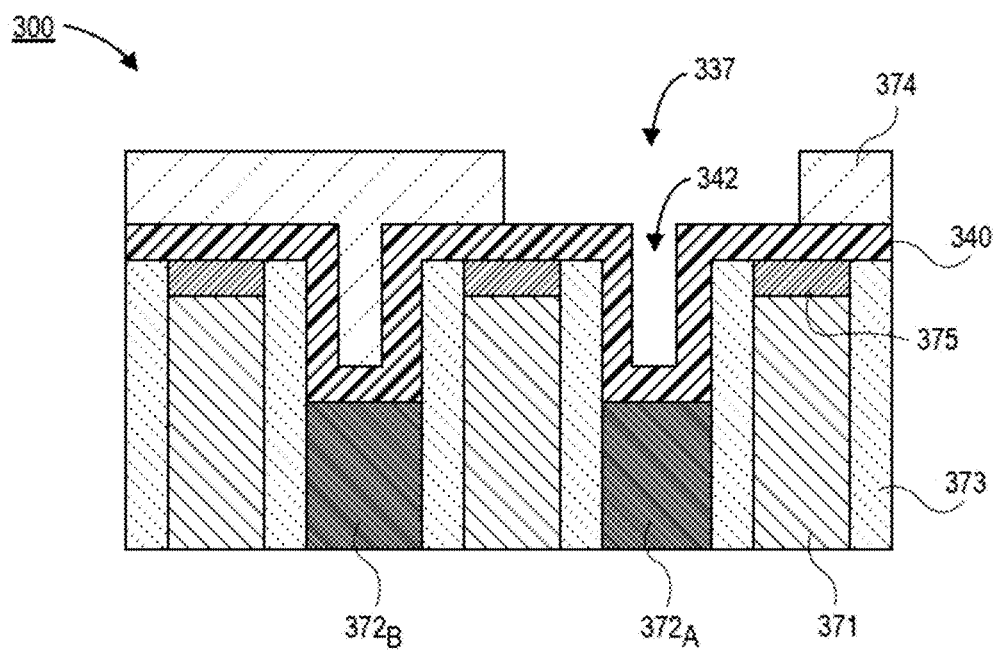
FIG. 12D is a cross-sectional illustration of a semiconductor device after the second ILD is patterned, in accordance with an embodiment.

Referring now to FIG. 12D, a cross-sectional illustration after an opening 337 is formed into the second ILD 374 is shown, in accordance with an embodiment. In an embodiment, the opening 337 may be positioned above the gate contact 372A. The opening 337 may result in a second opening 342 being cleared so that sidewalls of the VEB mask layer 340 are exposed.

Figure 12E:
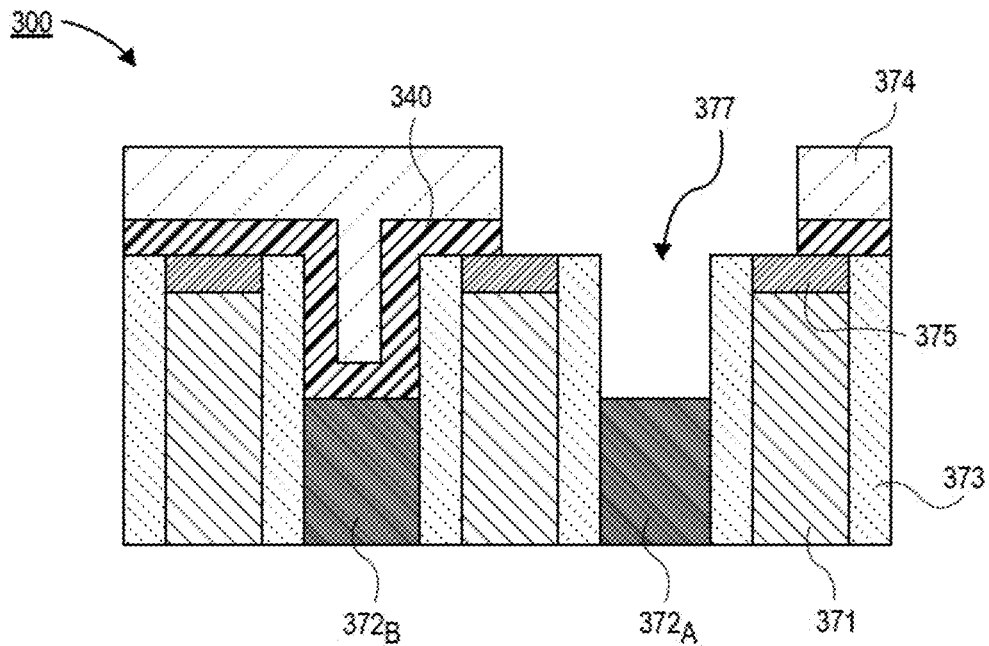
FIG. 12E is a cross-sectional illustration of a semiconductor device after exposed portions of the VEB mask layer are removed, in accordance with an embodiment.

Referring now to FIG. 12E, a cross-sectional illustration after the VEB mask layer 340 in the opening 337 is removed is shown, in accordance with an embodiment. In an embodiment, the VEB mask layer 340 may be removed with an isotropic etching process. Removal of the VEB mask layer 340 results in the opening 377 being cleared above the gate contact 372A. In an embodiment, a width of the opening 377 is smaller than a width of the opening 337 that passes through the second ILD 374.

Figure 12F:
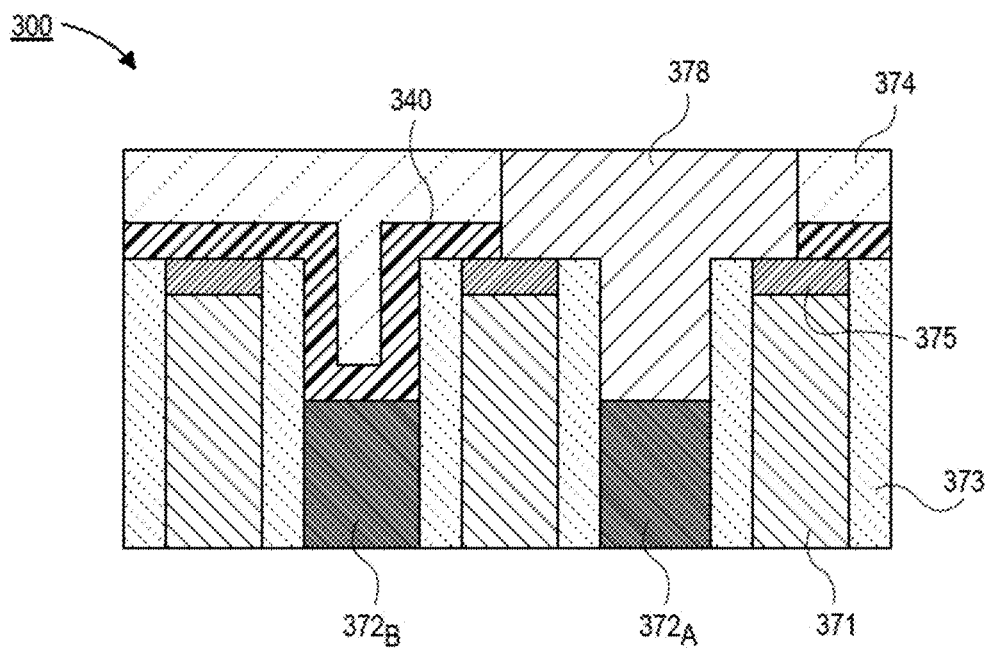
FIG. 12F is a cross-sectional illustration of a semiconductor device after a fill metal is disposed in the opening, in accordance with an embodiment.

Referring now to FIG. 12F, a cross-sectional illustration after a fill metal 378 is disposed in the opening 377 is shown, in accordance with an embodiment. In an embodiment, the fill metal 378 may be in direct contact with the gate contact 372A. Furthermore, the fill metal 378 may also be in contact with portions of the VEB mask layer 340. In an embodiment, the fill metal 378 may have a first width in the opening 377 and a second width that is greater than the first width through the second ILD 374. In some embodiments, a portion of the fill metal 378 may be directly above the S/D contacts 371 that are adjacent to the gate contact 372A.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 13:
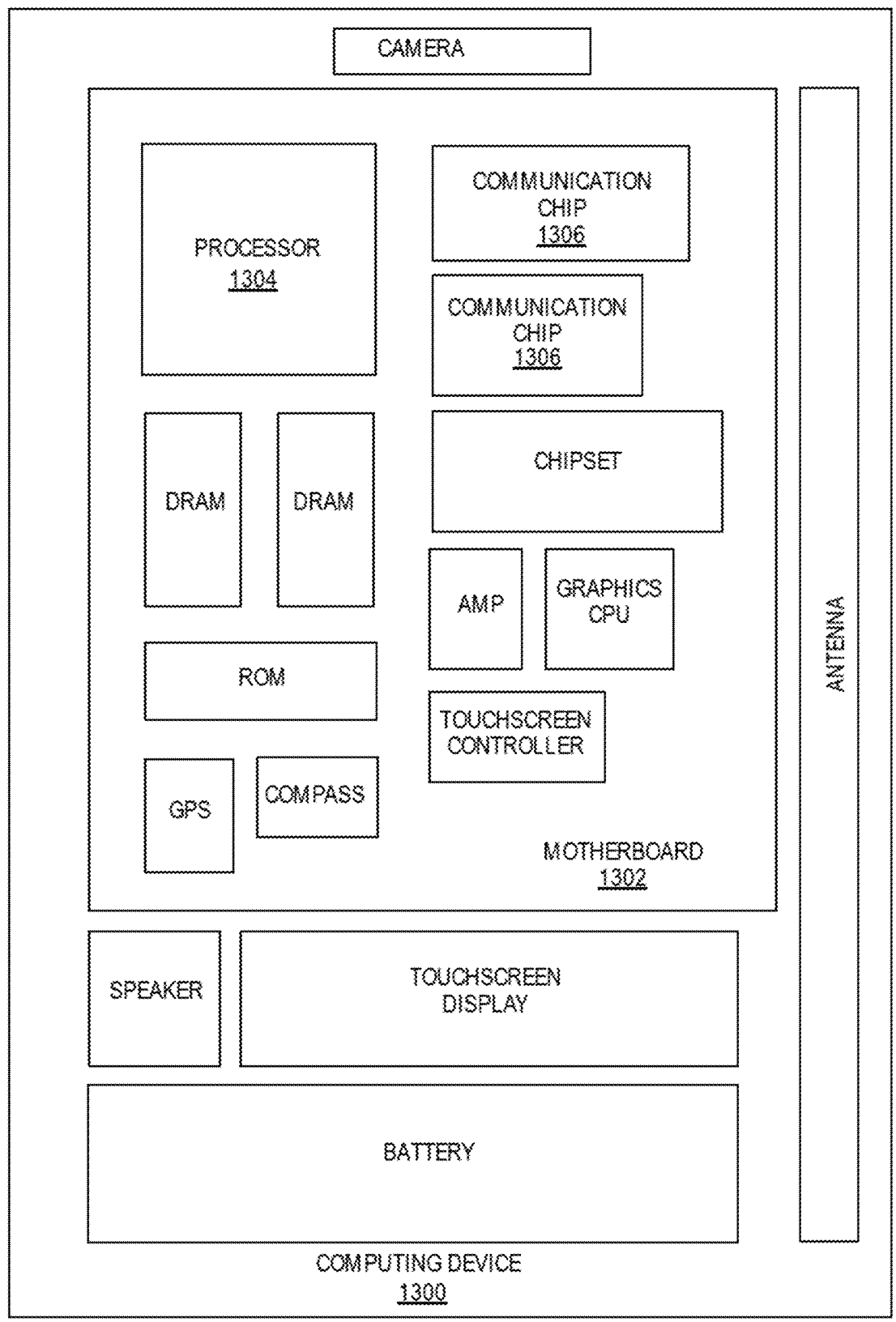
FIG. 13 illustrates a computing device in accordance with one implementation of an embodiment of the disclosure.

FIG. 13 illustrates a computing device 1300 in accordance with one implementation of an embodiment of the disclosure. The computing device 1300 houses a board 1302. The board 1302 may include a number of components, including but not limited to a processor 1304 and at least one communication chip 1306. The processor 1304 is physically and electrically coupled to the board 1302. In some implementations the at least one communication chip 1306 is also physically and electrically coupled to the board 1302. In further implementations, the communication chip 1306 is part of the processor 1304.

Depending on its applications, computing device 1300 may include other components that may or may not be physically and electrically coupled to the board 1302. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1306 enables wireless communications for the transfer of data to and from the computing device 1300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1306 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1300 may include a plurality of communication chips 1306. For instance, a first communication chip 1306 may be dedicated to shorter range wireless communications such as Wi-Fi and Bluetooth and a second communication chip 1306 may be dedicated to longer range wireless communications such as GPS, EDGE, GPRS, CDMA, WiMAX, LTE, Ev-DO, and others.

The processor 1304 of the computing device 1300 includes an integrated circuit die packaged within the processor 1304. In an embodiment, the integrated circuit die of the processor may comprise a BEOL stack that comprises one or more plugs and/or vias that are manufactured using a VEB mask layer, as described herein. The term "processor" may refer to any device or portion of a device that processes electronic data from registers and/or memory to transform that electronic data into other electronic data that may be stored in registers and/or memory.

The communication chip 1306 also includes an integrated circuit die packaged within the communication chip 1306. In an embodiment, the integrated circuit die of the communication chip m may comprise a BEOL stack that comprises one or more plugs and/or vias that are manufactured using a VEB mask layer, as described herein.

In further implementations, another component housed within the computing device 1300 may comprise a BEOL stack that comprises one or more plugs and/or vias that are manufactured using a VEB mask layer, as described herein.

In various implementations, the computing device 1300 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1300 may be any other electronic device that processes data.

Figure 14:
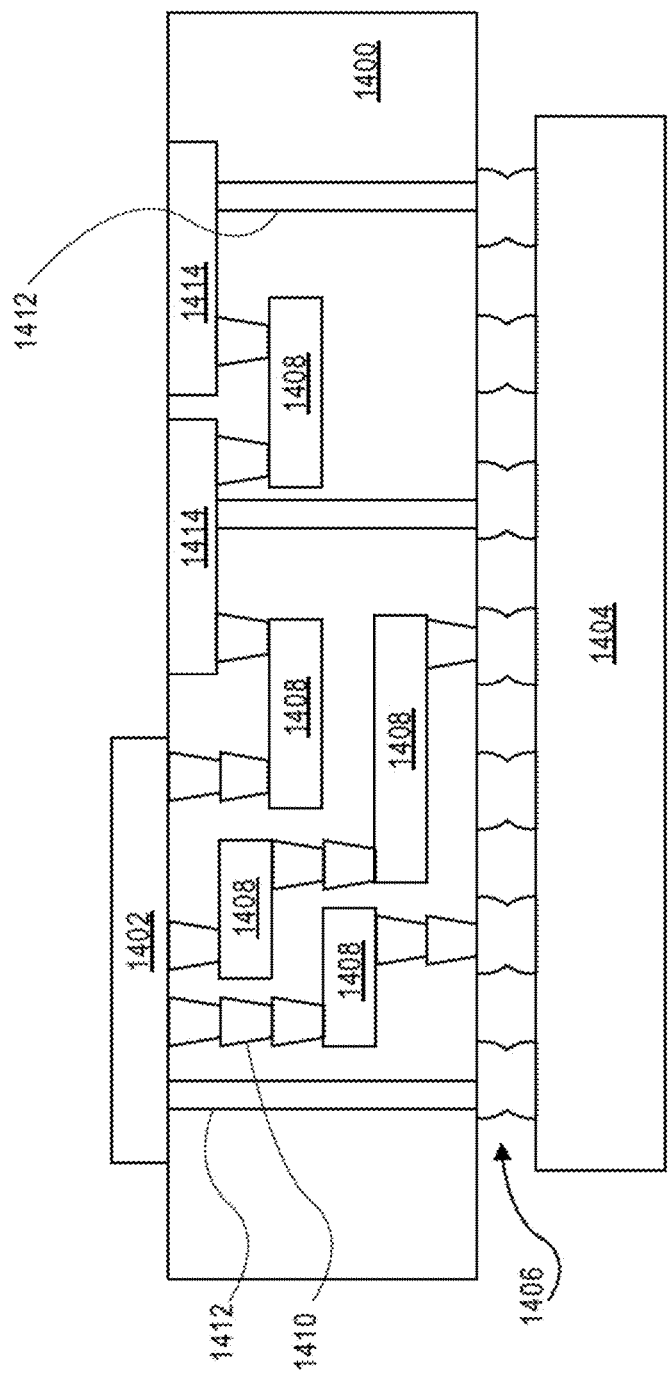
FIG. 14 is an interposer implementing one or more embodiments of the disclosure.

FIG. 14 illustrates an interposer 1400 that includes one or more embodiments of the disclosure. The interposer 1400 is an intervening substrate used to bridge a first substrate 1402 to a second substrate 1404. The first substrate 1402 may be, for instance, an integrated circuit die. The second substrate 1404 may be, for instance, a memory module, a computer motherboard, or another integrated circuit die. In an embodiment, one or both of the first substrate 1402 and the second substrate 1404 may comprise a BEOL stack that comprises one or more plugs and/or vias that are manufactured using a VEB mask layer, in accordance with embodiments described herein. Generally, the purpose of an interposer 1400 is to spread a connection to a wider pitch or to reroute a connection to a different connection. For example, an interposer 1400 may couple an integrated circuit die to a ball grid array (BGA) 1406 that can subsequently be coupled to the second substrate 1404. In some embodiments, the first and second substrates 1402/1404 are attached to opposing sides of the interposer 1400. In other embodiments, the first and second substrates 1402/1404 are attached to the same side of the interposer 1400. And in further embodiments, three or more substrates are interconnected by way of the interposer 1400.

The interposer 1400 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer 1400 may include metal interconnects 1408 and vias 1410, including but not limited to through-silicon vias (TSVs) 1412. The interposer 1400 may further include embedded devices 1414, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1400. In accordance with embodiments of the disclosure, apparatuses or processes disclosed herein may be used in the fabrication of interposer 1400.

Thus, embodiments of the present disclosure may comprise a BEOL stack that comprises one or more plugs, vias, and/or cuts that are manufactured using an edge placement error mitigation scheme, and the resulting structures.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example 1: a method of fabricating an interconnect layer over a substrate, comprising: forming a first grating of parallel first lines; forming a second grating of parallel second lines, wherein the second lines are substantially orthogonal to the first lines, and wherein the first lines and second lines define a plurality of first openings; disposing a first conformal mask layer over the first lines and the second lines, wherein the conformal mask layer partially fills the first openings and defines a second opening within each of the first openings; disposing a hardmask over the conformal mask layer, wherein the hardmask fills the second openings; patterning third openings into the hardmask, wherein the third openings clear the hardmask from at least one of the second openings; and removing the mask layer proximate to cleared second openings to clear first openings.

Example 2: the method of Example 1, further comprising: recessing the hardmask after forming the third openings, wherein a top surface of the hardmask is below a top surface of the mask layer.

Example 3: the method of Example 2, wherein the mask layer is removed with an isotropic etching process.

Example 4: the method of Example 3, wherein the remaining portions of the hardmask protect lateral sidewall surfaces of the mask layer from the isotropic etching process.

Example 5: the method of Examples 1-4, further comprising: transferring a pattern of the cleared first openings into the substrate.

Example 6: the method of Example 5, further comprising: removing remaining portions of the hardmask, the mask layer, and the second lines.

Example 7: the method of Example 6, wherein a conductive material is disposed into the opening in the substrate to form a via.

Example 8: the method of Examples 1-7, wherein the mask layer has a thickness that is less than 5 nm.

Example 9: the method of Examples 1-8, wherein the mask layer comprises silicon and nitrogen, silicon and oxygen, aluminum and oxygen, or titanium and nitrogen.

Example 10: the method of Examples 1-9, wherein the first lines have a pitch of approximately 30 nm or less, and wherein the first lines have a width of approximately 12 nm or less.

Example 11: a method of fabricating an interconnect layer of over a semiconductor substrate, comprising: forming a cross-grating over a substrate; lining the cross-grating with a mask layer; disposing a hardmask over the mask layer; patterning an opening into the hardmask, wherein the opening exposes surfaces of the mask layer; and removing the exposed surfaces of the mask layer.

Example 12: the method of Example 11, further comprising: recessing the hardmask after the hardmask is patterned, wherein a top surface of the hardmask is below a top surface of the mask layer.

Example 13: the method of Example 11 or Example 12, wherein the exposed surfaces of the mask layer are removed with an isotropic etching process.

Example 14: the method of Example 13, wherein the isotropic etching process is a timed etch.

Example 15: the method of Examples 11-14, further comprising: patterning the substrate using the cross-grating, the mask layer, and the hardmask as an etching mask.

Example 16: the method of Examples 11-15, wherein the mask layer has a thickness that is approximately 5 nm or less.

Example 17: the method of Examples 11-16, wherein an overlay error margin for patterning the hardmask is approximately 10 nm or greater.

Example 18: the method of Examples 11-17, wherein the mask layer comprises silicon and nitrogen, silicon and oxygen, aluminum and oxygen, or titanium and nitrogen.

Example 19: the semiconductor device, comprising: a first interlayer dielectric (ILD); a grid of source/drain (S/D) contacts and gate contacts in the first ILD, wherein the gate contacts and the S/D contacts are arranged in an alternating pattern, and wherein top surfaces of the gate contacts are below top surfaces of the S/D contacts so that an opening defined by sidewall surfaces of the first ILD is positioned over each of the gate contacts; a mask layer partially filling a first opening over a first gate contact; and a fill metal filling a second opening over a second gate contact that is adjacent to the first gate contact.

Example 20: the semiconductor device of Example 19, wherein the openings over the gate contacts are substantially rectangular.

Example 21: the semiconductor device of Example 19 or Example 20, further comprising a second ILD, wherein the second ILD fills a remainder of the first opening not filled by the mask layer.

Example 22: the semiconductor device of Example 21, wherein the mask layer has a thickness that is approximately 5 nm or less.

Example 23: an electronic system, comprising: a board; and a die electrically coupled to the board, wherein the die comprises: a first interlayer dielectric (ILD); a first gate contact in the first ILD; a second gate contact in the first ILD; a mask layer over and in contact with the first ILD and a top surface of the first gate contact, wherein the mask layer is conformal and lines a first opening into the first ILD over the first gate contact; and a fill metal filling a second opening over the second gate contact, wherein the fill metal is in direct contact with a top surface of the second gate contact.

Example 24: the electronic system of Example 23, wherein a remaining portion of the first opening that is not filled by the mask layer is filled by a second ILD.

Example 25: the electronic system of Example 23 or Example 25, wherein a thickness of the mask layer is approximately 5 nm or less.

What is claimed is:

1. A semiconductor device, comprising:
   a first interlayer dielectric (ILD);
   a grid of source/drain (S/D) contacts and gate contacts in the first ILD, wherein the gate contacts and the S/D contacts are arranged in a 1:1 alternating pattern along a first direction and along a second direction, the second direction orthogonal to the first direction, and wherein top surfaces of the gate contacts are below top surfaces of the S/D contacts so that an opening defined by sidewall surfaces of the first ILD is positioned over each of the gate contacts;
   a mask layer partially filling a first opening over a first gate contact; and
   a fill metal filling a second opening over a second gate contact that is adjacent to the first gate contact.

2. The semiconductor device of claim 1, wherein the openings over the gate contacts are substantially rectangular.

3. The semiconductor device of claim 1, further comprising a second ILD, wherein the second ILD fills a remainder of the first opening not filled by the mask layer.

4. The semiconductor device of claim 3, wherein the mask layer has a thickness that is approximately 5 nm or less.

5. An electronic system, comprising:
   a board; and
   a die electrically coupled to the board, wherein the die comprises:
      a first interlayer dielectric (ILD);
      a first gate contact in the first ILD;
      a second gate contact in the first ILD and spaced apart from the first gate contact by a distance along a first direction;
      a third gate contact in the first ILD and spaced apart from the first gate contact by the distance along a second direction, the second direction orthogonal to the first direction;
      a mask layer over and in contact with the first ILD and a top surface of the first gate contact, wherein the mask layer is conformal and lines a first opening into the first ILD over the first gate contact; and
      a fill metal filling a second opening over the second gate contact, wherein the fill metal is in direct contact with a top surface of the second gate contact.

6. The electronic system of claim 5, wherein a remaining portion of the first opening that is not filled by the mask layer is filled by a second ILD.

7. The electronic system of claim 5, wherein a thickness of the mask layer is approximately 5 nm or less.

* * * * *